United States Patent
Leonard et al.

(10) Patent No.: US 11,189,487 B2
(45) Date of Patent: Nov. 30, 2021

(54) METHOD AND APPARATUS FOR HIGH PRESSURE CURE OF FLOWABLE DIELECTRIC FILMS

(71) Applicant: Intel Corporation, Santa Clara, CA (US)

(72) Inventors: Jonathan E. Leonard, Portland, OR (US); Aravind S. Killampalli, Beaverton, OR (US); Chad Byers, Portland, OR (US); Jay P. Gupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 449 days.

(21) Appl. No.: 16/330,366

(22) PCT Filed: Sep. 30, 2016

(86) PCT No.: PCT/US2016/054670
§ 371 (c)(1),
(2) Date: Mar. 4, 2019

(87) PCT Pub. No.: WO2018/063288
PCT Pub. Date: Apr. 5, 2018

(65) Prior Publication Data
US 2021/0287901 A1    Sep. 16, 2021

(51) Int. Cl.
*H01L 21/02* (2006.01)
*H01L 21/67* (2006.01)

(52) U.S. Cl.
CPC .... *H01L 21/02337* (2013.01); *H01L 21/0217* (2013.01); *H01L 21/02118* (2013.01);
(Continued)

(58) Field of Classification Search
None
See application file for complete search history.

(56) References Cited

U.S. PATENT DOCUMENTS

2003/0207530 A1\* 11/2003 Yu ............... H01L 21/02255
                                                           438/243
2004/0058557 A1    3/2004 Eisele et al.
(Continued)

OTHER PUBLICATIONS

International Preliminary Report on Patentability dated Apr. 11, 2019 for PCT Patent Application No. PCT/US16/54670.
(Continued)

*Primary Examiner* — Alexander G Ghyka
(74) *Attorney, Agent, or Firm* — Green, Howard & Mughal LLP

(57) ABSTRACT

A high-pressure dielectric film curing apparatus, such as a high-pressure batch furnace, is controlled to an elevated cure temperature and super-atmospheric pressure for the duration of the film curing time with the cure pressure achieved at least partially with a vapor of aqueous ammonia in fluid communication with the chamber. The cure temperature may vary, for example between 175° C., and 400° C., or more. The cure pressure may also vary as limited by the saturated water vapor pressure, for example between 100 PSIA and 300 PSIA, or more. The aqueous ammonia may be injected into the chamber or vaporized upstream of the chamber. One or more carrier and/or diluent gas (vapor) may be introduced into the chamber to adjust the partial pressure of ammonia vapor, water vapor, and the diluent.

20 Claims, 6 Drawing Sheets

(52) U.S. Cl.
CPC .. *H01L 21/02164* (2013.01); *H01L 21/02167* (2013.01); *H01L 21/02356* (2013.01); *H01L 21/67109* (2013.01)

(56) References Cited

U.S. PATENT DOCUMENTS

| | | |
|---|---|---|
| 2004/0175958 A1 | 9/2004 | Lin et al. |
| 2011/0151677 A1 | 6/2011 | Wang et al. |
| 2011/0203523 A1 | 8/2011 | Strang |
| 2014/0363971 A1* | 12/2014 | Matsumoto ....... C23C 16/45525 438/653 |
| 2015/0118862 A1* | 4/2015 | Reilly ................... C23C 16/401 438/778 |
| 2016/0194758 A1 | 7/2016 | Nemani et al. |
| 2016/0343609 A1* | 11/2016 | Jhaveri ............. H01L 21/02164 |
| 2017/0250106 A1* | 8/2017 | Lin ................... H01L 29/66795 |

OTHER PUBLICATIONS

International Search Report and Written Opinion for International Patent Application PCT/US16/54670, dated Jun. 30, 2017.
Wilson, Thomas A., "The Total and Partial Vapor Pressures of Aqueous Ammonia Solutions" University of Illinois Bulletin, vol. XXII, No. 23, Feb. 2, 1925, 60 pgs.

* cited by examiner

US 11,189,487 B2

METHOD AND APPARATUS FOR HIGH PRESSURE CURE OF FLOWABLE DIELECTRIC FILMS

CLAIM OF PRIORITY

This Application is a National Stage Entry of, and claims priority to, PCT Application No. PCT/US2016/054670, filed on Sep. 30, 2016 and titled "METHODS & APPARATUS FOR HIGH PRESSURE CURE OF FLOWABLE DIELECTRIC FILMS", which is incorporated by reference in its entirety for all purposes.

BACKGROUND

Efforts to extend Moore's law for integrated circuitry (IC) continue to reduce semiconductor manufacturing feature geometries. With these reductions it has become more challenging to back-fill topographic features with deposited materials. Flowable dielectric deposition processes enable gap fill in high aspect ratio structures. One class of flowable dielectrics being investigated are deposited as polymers which may be subsequently treated with one or more chemical processes (e.g., to cross-link the polymers), and then thermal processes to densify the film and improve uniformity of the film properties across the film thickness. The polymer deposition processes are typically low-pressure (sub-atmospheric) processes, which are well suited to safely handling various reactive gas chemistries. As such, much development effort has been directed toward sub-atmospheric in-situ thermal processing and curing of flowable dielectric films that is performed within the polymer deposition chamber. Such processing however is not an efficient use of the deposition chamber, nor is sub-atmospheric pressure necessarily optimal for the cure process.

A high-pressure (e.g., super-atmospheric pressure) cure process, may, for example, serve to both cross-link and densify a flowable dielectric material. Systems and methods to perform high pressure cures (HPC) may therefore be advantageous in the fabrication of ICs incorporating flowable dielectric materials.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
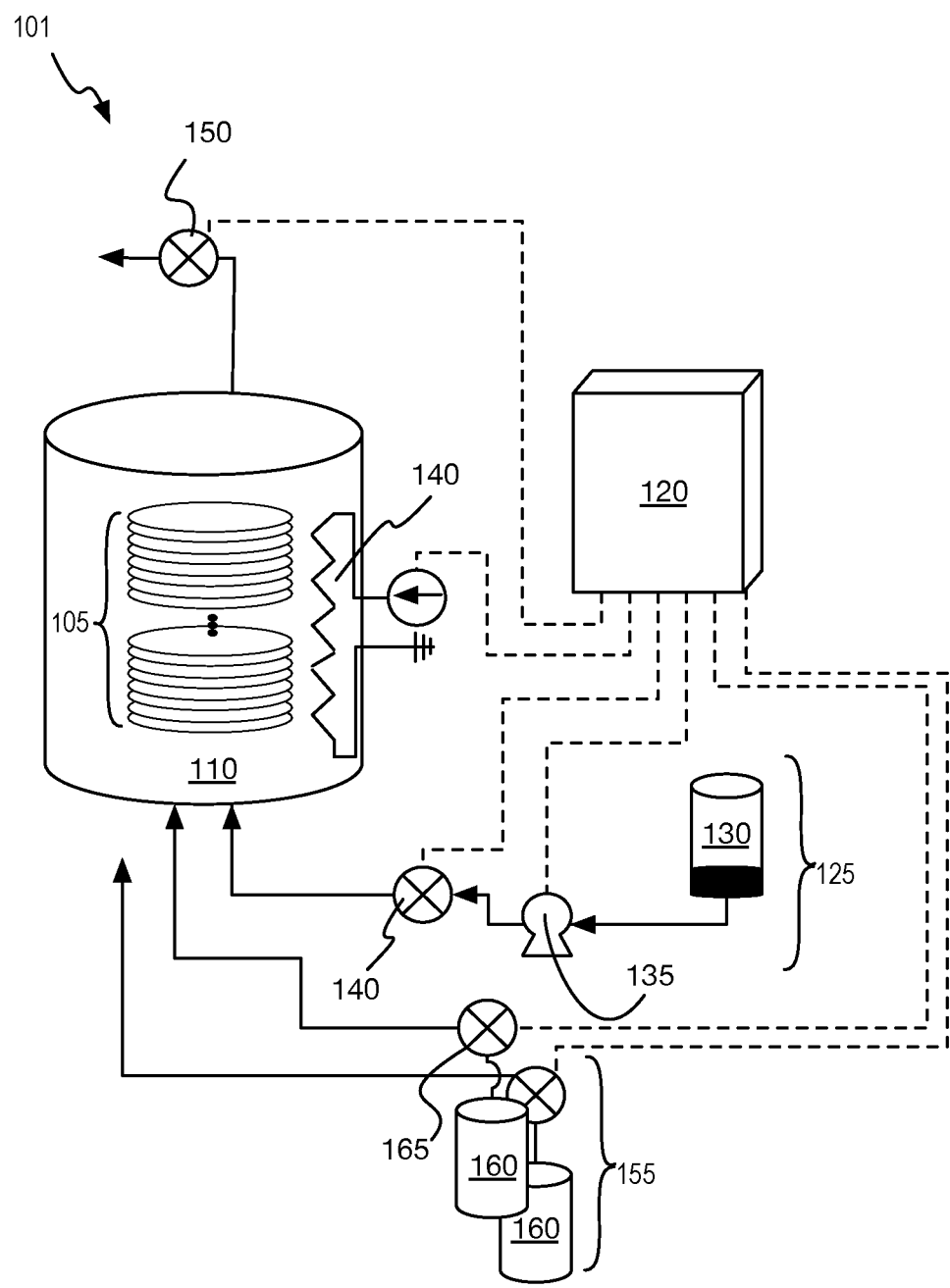
FIG. 1 is a schematic illustrating a high pressure cure apparatus, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Certain portions of the material disclosed herein may be implemented in hardware, for example as logic circuitry in a processor responsible for controlling parameters of a high pressure curing apparatus. Certain other portions may be implemented in hardware, firmware, software, or any combination thereof. At least some of the material disclosed herein may also be implemented as instructions stored on a machine-readable medium, which may be read and executed by one or more computer processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other similarly non-transitory, tangible media.

Described below are exemplary embodiments of HPC processes and HPC furnaces. While some ex-situ cure processes performed on a hot plate, for example, may be an improvement over in-situ sub-atmospheric cure processes, the inventors have determined cure pressures many times that of atmosphere offer even better film properties and/or uniformity of film properties across the film thickness. One advantageous platform for providing the high temperatures and pressures desirable for a flowable dielectric cure is a high-pressure furnace, for example of the type typically employed in the IC industry for some thermal oxidations. However, the various thermal processes for which a typical high pressure furnace has been developed do not encompass the introduction of chemistries advantageous for the curing of flowable dielectrics. For example, high-pressure furnaces are typically designed with a steam source, oxygen source, and a handful of carrier gases, such as $N_2$ gas. It can be hazardous to introduce into such a furnace an atypical source more favorable for curing of flowable dielectrics. For example, a complete redesign of the furnace gas panel, and/or furnace exhaust, and/or furnace containment system may be needed where the curing chemistry source is hazardous because of toxicity, and/or corrosivity, etc.

In some embodiments, a HPC apparatus includes a chamber pressurized, at least in part, with ammonia ($NH_3$) vapor. The inventors have found that flowable dielectric films may be cured advantageously in an environment including ammonia vapor. The inventors have found that a flowable dielectric can be cured at elevated temperature to good effect in an ammonia vapor having a desired partial pressure at a cure (total) pressure that is many times atmospheric pressure. The inventors have further found that higher cure pressures can cure greater thicknesses of flowable dielectric, which is important as flowable dielectrics may backfill high aspect ratio topography on a substrate. An ideal cure process fully cures the flowable material disposed in the bottom of the deepest topographic recesses. The introduction of ammonia vapor into a high-pressure furnace chamber is however complicated by the difficulty in safely conveying such a vapor to the chamber at high pressure. Generally, high-pressure capable furnaces can be readily configured for gaseous sources. Therefore, in some embodiments a gaseous mixture of anhydrous ammonia in a carrier, such as $N_2$, may be supplied to the HPC chamber. The concentration of ammonia in such a gaseous supply is however limited by the chamber (cure) pressure with a more dilute mixture being required for higher cure pressures to avoid condensate in the supply lines, which may be advantageous to maintain at room temperature. Another problem with gaseous anhydrous ammonia mixtures is that a dilute pre-mix is typically available only in standard 49 L gas cylinders. One such cylinder however may not last more than a few (e.g., 10) cure processes before a bottle change would be needed.

In some other embodiments, 100% anhydrous ammonia may be supplied to the HPC chamber during a high-pressure flowable dielectric cure process. As room temperature anhydrous ammonia liquefies at pressures over ~85 PSIA, greater cure pressures may require pre-heating the source delivery system (e.g., bottle and lines), or liquid injection into the cure chamber. As pre-heating will incur significant capital expenditures, direct liquid injection may be preferable, however anhydrous ammonia is also caustic and hazardous in this concentrated form. Liquid supply systems are therefore subjected to the corrosivity of anhydrous ammonia. Similarly, a system to contain supply system leaks must be implemented as the vapor is an eye and respiratory system irritant. The difficulty of delivering concentrated ammonia may also be unnecessary from the standpoint of the cure process, where only a tens or hundreds of ppm $NH_3$ vapor may be needed.

In some advantageous embodiments, a vapor of aqueous ammonia ($NH_4OH$) is supplied to the HPC chamber during a high-pressure flowable dielectric cure process. Such aqueous ammonia solutions may have a wide range of ammonia concentrations (e.g., 1%-35%). These safe, dilute ammonia solutions may be vaporized at the cure temperature to supply a fraction of the cure process pressure. In contrast to dilute gaseous supplies, a cure process may only consume small quantities of aqueous ammonia (e.g., 100 mL-1 L). In contrast to concentrated anhydrous supplies, aqueous ammonia solutions may be more readily adapted into a high-pressure furnace, operated with a greater margin of safety as a less hazardous source, and more compatible with cure processes requiring low ammonia partial pressures. As such, embodiments employing a vapor of aqueous ammonia may provide desirable cure conditions without the difficulties associated with gaseous ammonia mixtures or an anhydrous ammonia source.

FIG. 1 is a schematic illustrating a HPC apparatus 101, in accordance with some embodiments. HPC apparatus 101 may include any components known for a vertical diffusion furnace suitable for IC fabrication processes. In addition, HPC apparatus 101 is configured with hardware to deliver a vapor of aqueous ammonia by directly injecting aqueous ammonia into a cure process chamber 110 constructed to operate at super-atmospheric pressures. As shown, during a cure process a plurality of substrates 105 are disposed within cure process chamber 110. Substrates 105 in the exemplary embodiments are disk-shaped, typical of a semiconductor (e.g., silicon) wafer. A flowable dielectric material has been deposited on at least one side of each substrate 105. The flowable dielectric material may, for example, have been applied ex-situ of the cure apparatus 101. Any flowable dielectric material may have been deposited onto substrates 105 with any process, such as any flowable-chemical-vapor-deposition (FCVD) process or flowable spin-on deposition (FSD) process.

One or more cure process gases and cure process liquids are in fluid communication with chamber 110 so that they may be provisioned during execution of a high-pressure cure process. Chamber 110 is configured to be heated to an elevated temperature of 175° C., or more, during execution of the cure process. In the illustrated embodiment, resistive heater coils 140 heat chamber 110. However, an inductive heater, combustion process, or other known technique may be employed to heat chamber 110 in alternative embodiments. Process gases (vapors) are to be exhausted from chamber 110 through an exhaust valve 150. In the exemplary embodiment illustrated in FIG. 2, HPC apparatus 101 includes both a liquid source supply 125 and gas source supply 155 in fluid communication with chamber 110. Liquid source supply 125 includes a source liquid 130 pressurized beyond the process pressure (e.g., by pump 135), and a metering valve 140. Source liquid 130 may enter chamber 110 through an injector. Source liquid 130 may be any liquid ammonia. In some advantageous embodiments, source liquid 130 is aqueous ammonia. In some specific embodiments, source liquid 130 is aqueous ammonia having an ammonia concentration of 35 wt %, or less (e.g., 1 wt %-35 wt %). The concentration of aqueous ammonia, along with partial pressures of any source gases additionally introduced into chamber 110, may be selected to deliver a desired ammonia vapor partial pressure.

Figure 5:
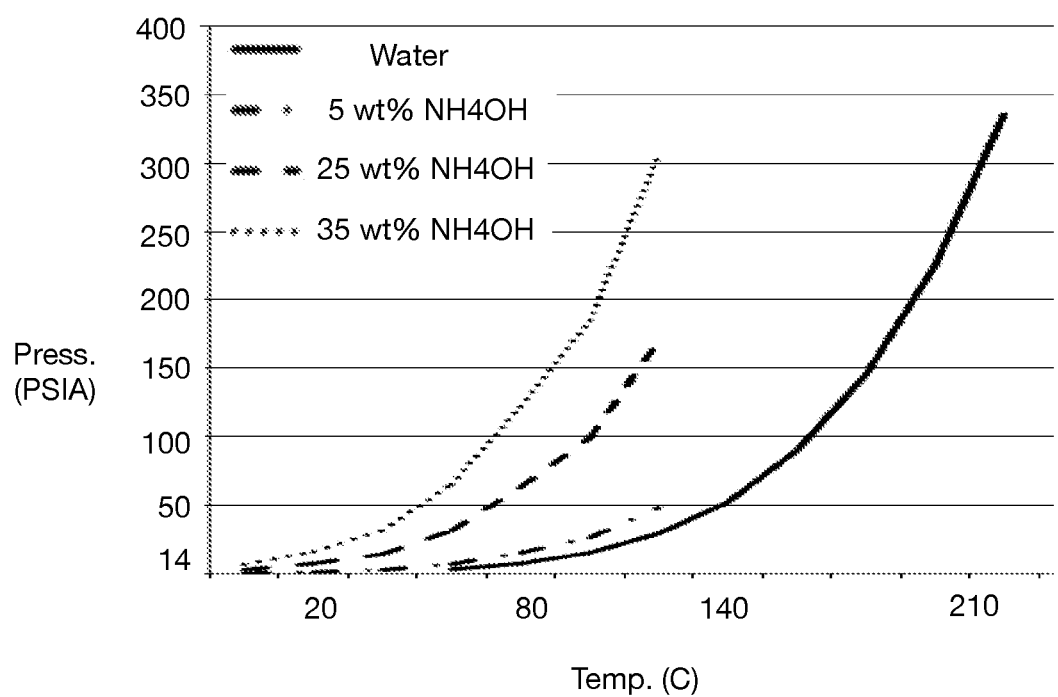
FIG. 5 is a graph illustrating vapor pressure curves for aqueous ammonia solutions and water vapor, in accordance with some embodiments.

During a cure process, pressurized source liquid 130 is injected directly into chamber 110 where it is vaporized at the cure temperature and cure pressure maintained through actions of a computerized cure process controller 120. Advantageously, the cure temperature and pressure are sufficiently high to completely vaporize both the ammonia fraction and water fraction of aqueous ammonia injected into chamber 110. FIG. 5 is a graph illustrating vapor pressure curves for exemplary aqueous ammonia solutions and water vapor, in accordance with some embodiments. The solid line in FIG. 5 is the saturated stream curve setting the lower cure temperature limit for a given cure pressure to ensure no water condensate within the cure chamber. Generally to account for inefficiencies in the HPC apparatus 101 (e.g., cold spots, etc.), the cure process window will be to the left of the solid line with the cure pressure being maintained below the saturated vapor pressure of water at the cure temperature. As further shown in FIG. 5, the vapor pressure of aqueous ammonia solutions is a function of the ammonia concentration with ammonia vapor pressure being significantly higher than that of water ($H_2O$).

Gas source supply 155 includes one or more source gases 160 plumbed through a gas (mass) flow controller 165 and into chamber 110. Source gases 160 may include any suitable gas, such as, but not limited to, gaseous nitrogen ($N_2$) and/or oxygen (02) pressurized beyond the cure process pressure. Source gases 160 may be controlled to a flow rate in conjunction with the exhaust rate to arrive at a desired cure pressure and partial pressure of ammonia vapor and water. In some embodiments, (e.g., where a very low ammonia partial pressure is desired), source gases 160 may additionally include a water vapor source to supplement the water fraction in liquid supply 130. Water vapor provided by a source gases 160 may be delivered to chamber 110 by $N_2$, or an alternate carrier gas, for example.

Controller 120 may be any fixed function or field programmable computer platform, for example as further described elsewhere herein. While controller 120 is shown as a centralized computer platform communicatively coupled to each of heater 140, exhaust valve 150, gas flow controller 165, pump 135, and metering valve 140, separate discrete microcontrollers may be employed to the same effect. In some advantageous embodiments, controller 120 is to send commands to pump 135, and/or metering valve 140 controlling the rate of aqueous ammonia liquid injection. In some advantageous embodiments, controller 120 is to send commands by way of digital or analog signals to control each of heater 140, exhaust valve 150, gas flow controller 165, pump 135, and metering valve 140. As described further below, cure process controller 120 may execute a cure recipe sequence comprising various predetermine process parameter set points associated with predetermined cure process durations. Control signals set to each of the control points may therefore achieve a desired total (cure) pressure and various partial pressures in any manner known in the art of furnace control.

Figure 2:
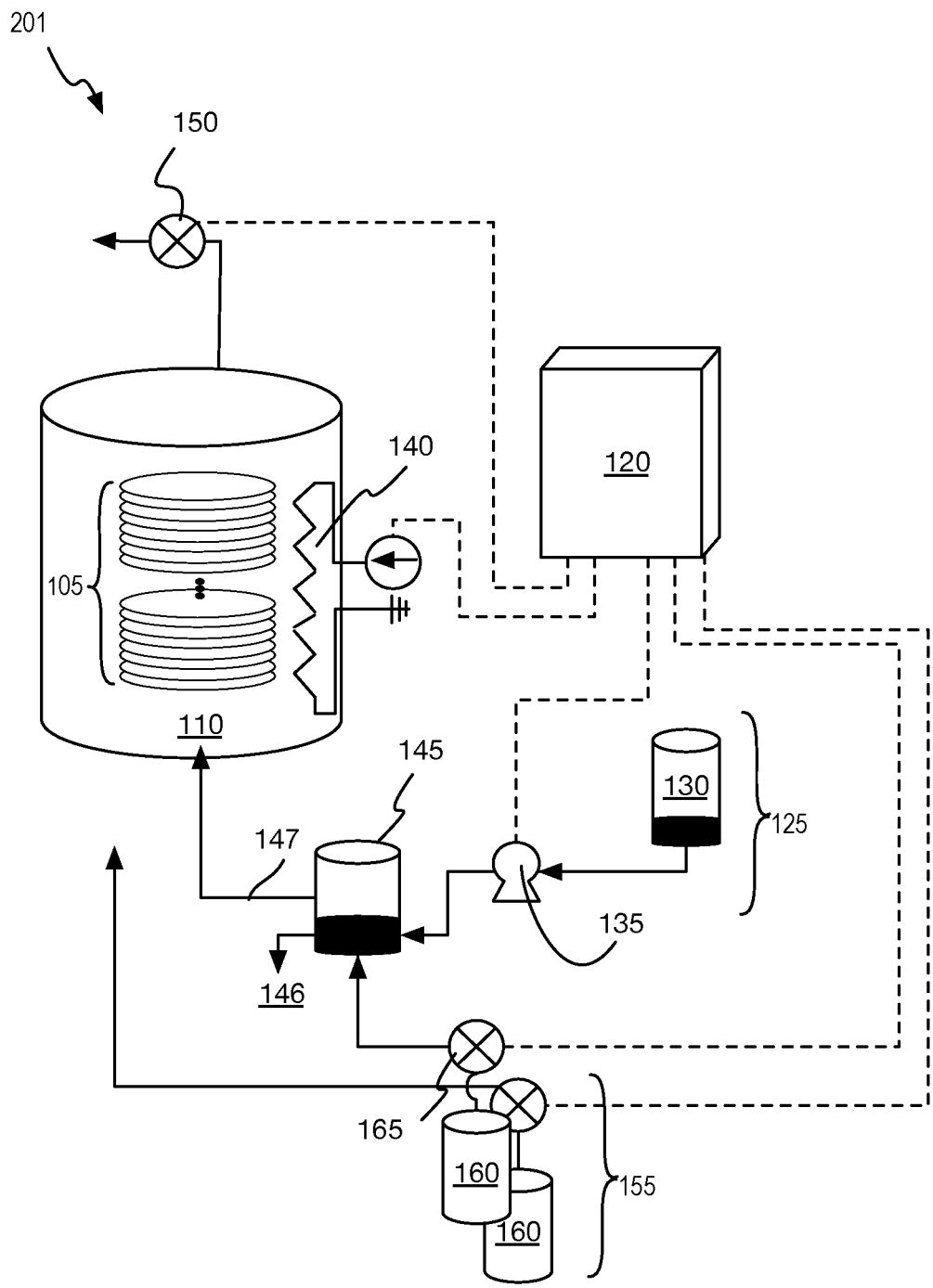
FIG. 2 is a schematic illustrating a high pressure cure apparatus, in accordance with some embodiments.

FIG. 2 is a schematic illustrating a high-pressure cure apparatus 201, in accordance with some embodiments. HPC apparatus 201 may include any features known for a vertical diffusion furnace suitable for IC fabrication processes. In addition, HPC apparatus 201 is configured with hardware to deliver a vapor of aqueous ammonia by evaporating/vaporizing aqueous ammonia upstream of cure process chamber 110 and conveying that vapor to chamber 110 with a carrier gas. Components of HPC apparatus 201 having the same function as those in HPC apparatus 101 are illustrated in FIG. 2 with the same reference number. As shown in FIG. 2, liquid delivery system 125 again includes liquid source 130, which may be any of the liquid ammonia sources described above. Liquid delivery system 125 further includes an aqueous ammonia vaporizer 145. Aqueous ammonia vaporizer 145 may be in the form of a boiler, helical coil evaporator, gas bubbler, or the like know to be suitable for generating a desired ammonia vapor supply 147. Ammonia vapor supply 147 will include water vapor for embodiments where liquid source 130 is aqueous ammonia or where water vapor is bubbled into anhydrous ammonia. Ammonia vapor supply 147 is mixed with a carrier gas provided by source gas supply 155. In some embodiments, ammonia vapor supply 147 is pressurized to exceed the cure pressure maintained in chamber 110. Ammonia vapor supply 147 may be pressurized by source gas supply 155, for example, by bubbling the carrier gas through the liquid ammonia solution contained in vaporizer 145, which is heated to achieve a desired water vapor pressure and/or ammonia vapor pressure. In some embodiments, ammonia vapor supply 147 is pressurized to at least 100 PSIA, and may be pressurized to 325 PSIA, or more. Vaporizer 145 includes a heat source, such as a resistive heater. In some embodiments, aqueous ammonia is supplied to the heated vaporizer 145 where the mixture is vaporized to the component vapor pressures. Pump 135 may be employed to convey the aqueous ammonia into and/or through vaporizer 145. Depending on the aqueous ammonia concentration within vaporizer 145, a desired vapor pressure of ammonia vapor and water vapor may be provided by heating vaporizer 145 to 100-300° C., or more. Depending on the ammonia vapor supply 147 pressure and temperature of vaporizer 145, the aqueous ammonia vapor supply 147 may vary from predominantly ammonia vapor at lower vaporizer temperatures to predominantly water vapor at higher temperatures, for example according to the vapor pressure curves shown in FIG. 5. Vaporizer 145 may therefore be operated at a predetermined temperature that provides a desired composition of ammonia vapor and water vapor for an ammonia vapor supply 147 that is pressurized slightly above (e.g., 10-20 PSI) the cure pressure. At lower temperatures where the aqueous ammonia vapor supply 147 is predominantly ammonia vapor, water-rich condensate 146 may collect in, and/or be expelled from, vaporizer 145. At higher temperatures where the aqueous ammonia vapor supply 147 is predominantly water vapor (e.g., all of source liquid 130 is vaporized), no condensate 146 may collect in, and/or be expelled from, vaporizer 145. In alternative embodiments, liquid source 130 is liquid ammonia that is simply contained within vaporizer 145, and a gas source is introduced into vaporizer 145. For example, $N_2$ may be bubbled through the liquid ammonia contained within vaporizer 145. For such embodiments, pump 135 is unnecessary.

The gas mixture including the ammonia vapor is flowed into chamber 110 during the cure process. Source gases 160 may be controlled to a flow rate in conjunction with the exhaust rate to arrive at a desired cure pressure and partial pressure of ammonia vapor and water vapor. In some embodiments, (e.g., where a very low ammonia partial pressure is desired or where a water-free carrier gas is bubbled through liquid ammonia), source gases 160 may additionally include a water vapor source to supplement the water fraction originating from liquid supply 130. Water vapor provided by a source gas 160 may be delivered to chamber 110 by $N_2$ or an alternate carrier gas, for example.

Figure 3:
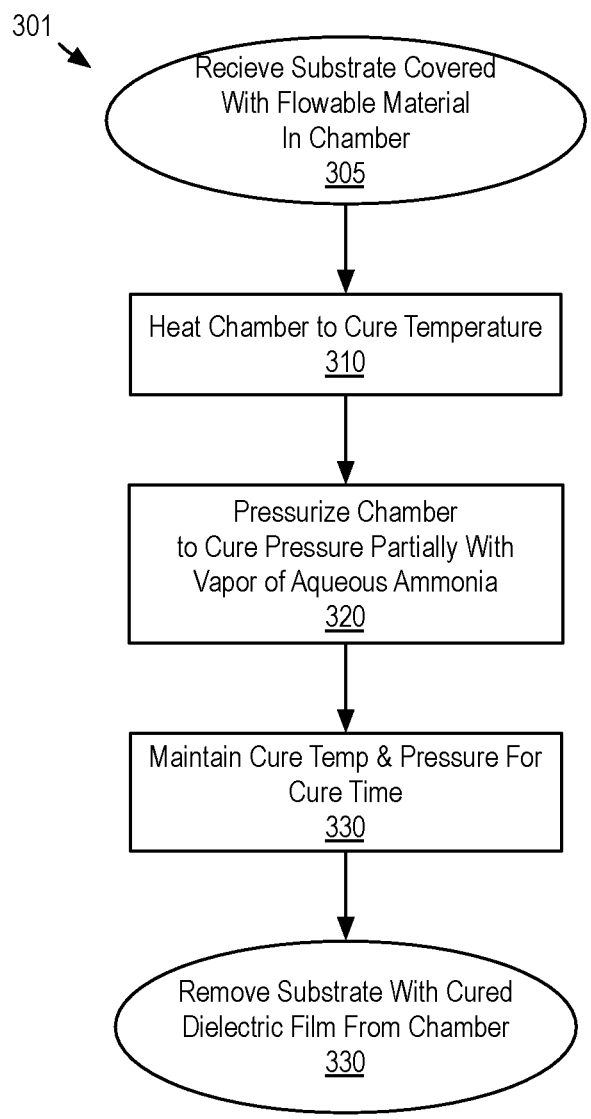
FIG. 3 is a flow diagram illustrating methods of curing a flowable dielectric film, in accordance with some embodiments.

Various high-pressure cure processes may be performed with the HPC apparatus 101 or 201, or variants thereof. FIG. 3 is a flow diagram illustrating methods 301 for curing a flowable dielectric film, in accordance with some embodiments. Methods 301 begin with receiving a substrate covered with flowable polymer into a HPC process chamber 305. In exemplary embodiments, the substrate is a semiconductor wafer, such as a 300-450 mm diameter silicon wafer. Other substrates known in the art may also be suitable. In some specific examples, the substrate surface has topography that is filled with the flowable material to be cured during methods 301. In some embodiments, the topography comprises trenches between fins or other features extending from the substrate surface. The dimensions of the features and spacing between the features may vary with IC application, but in some embodiments the trenches have a height-to-width aspect ratio exceeding 10:1, or 20:1, or more.

In some exemplary embodiments, the flowable material is deposited upstream of methods 301, for example, ex-situ of an HPC chamber. For example, the flowable material may be deposited in a sub-atmospheric CVD chamber separate from the HPC chamber employed to cure the flowable material. The flowable material may be a silicon nitride composition (e.g., having more Si—N bonds than Si—O bonds), a silicon dioxide composition (e.g., having more Si—O bonds than Si—N bonds), and/or a hydrogen saturated composition (e.g., having many Si—H bonds). A flowable material deposition process may, for example, comprise reacting a silicon-containing precursor, an oxygen-containing precursor, and/or an nitrogen-containing precursor in the deposition chamber at a process pressure below 50 Torr to form a flowable polymer. One exemplary class of flowable polymers is polysilazane $(SH_2HN)_n$, for which many silicon-containing precursors are known. However, many alternative flowable polymers may be deposited following one or more techniques known in the art enlisting one or more precursors known in the art.

Methods 301 continue at operation 310 where the HPC chamber is heated to a cure temperature. Operation 310 may be performed before or after the substrates are pushed into the HPC chamber. In some embodiments, the chamber is heated to a cure temperature of at least 175° C., advantageously at least 250° C., and more advantageously at least 400° C. In some embodiments, the chamber is heated to a cure temperature that is no greater than 450° C. At operation 320, the HPC chamber is pressurized to a cure pressure exceeding standard atmospheric pressure. Pressurization of the HPC chamber in some exemplary embodiments is at least in part with a vapor of aqueous ammonia. Pressurizing the chamber to the cure pressure at operation 320 may further comprise injecting aqueous ammonia into the HPC chamber to generate the aqueous ammonia vapor in-situ. In some alternative embodiments, pressurizing the chamber to the cure pressure further comprises injecting aqueous ammonia into a vaporizer ex-situ (e.g., upstream of the HPC chamber), and conveying a vapor of the aqueous ammonia from the vaporizer to the HPC chamber, for example with a carrier gas.

The cure pressure developed at operation 320 is advantageously below the saturated vapor pressure of water at the cure temperature, for example to ensure any cold spots within the HPC chamber are also below the saturated vapor pressure of water. In exemplary embodiments, the HPC chamber is pressurized to at least 100 PSIA, advantageously at least 200 PSIA, and more advantageously at least 325 PSIA. In a specific embodiment where the cure temperature is at least 175° C., the cure pressure is at least 100 PSIA. In a specific embodiment where the cure temperature is at 250° C., the cure pressure is at least 250 PSIA. In a specific embodiment where the cure temperature is at least 400° C., the cure pressure is at least 325 PSIA. The vapor of aqueous ammonia may have a wide range of partial pressures of ammonia vapor and water vapor as a function of the vapor pressures for each component of the aqueous solution at the cure pressure and cure temperature. At cure pressures sufficiently below the saturated vapor pressure of water at the cure temperature, there will be no condensate in the HPC chamber and the partial pressures of ammonia and water will be approximately their respective vapor pressures multiplied by their mole fractions in the aqueous solution. The balance of the cure pressure may be maintained with a gas source, such as $N_2$.

At operation 330, the cure pressure and temperature is maintained for a predetermined cure time. The cure time may vary as a function of cure temperature and/or cure pressure. In some embodiments, the cure time is predetermined to convert the flowable dielectric (e.g., polymer) for example, into a silicon oxide, a silicon nitride, and/or a silicon carbide (carbon-doped silicon), as desired. The cure time may be further predetermined to convert flowable dielectric from a silicon nitride composition (e.g., having more Si—N bonds than Si—O bonds) into a silicon dioxide composition (e.g., having more Si—O bonds than Si—N bonds). The cure time may be in some embodiments be predetermined to convert flowable dielectric from a silicon oxide composition (e.g., having more Si—O bonds than Si—N bonds) to a silicon nitride composition (e.g., having more Si—N bonds than Si—O bonds). The cure time may be in some embodiments be predetermined to convert flowable dielectric from a hydrogen saturated composition (e.g., having more Si—H bonds than Si—C bonds) to a hydrogen unsaturated composition (e.g., having more Si—C bonds than Si—H bonds). In some specific embodiments where the cure temperature at least 175° C., and the cure pressure is at least 100 PSIA, the cure time is at least one hour, advantageously at least two hours, and may be four hours, or more.

Upon reaching the cure process time, methods 301 are completed with removal of the substrate(s), now covered with a cured dielectric film, from the cure chamber. Any known IC fabrication process may then be performed following to the completion of methods 301.

Figure 4:
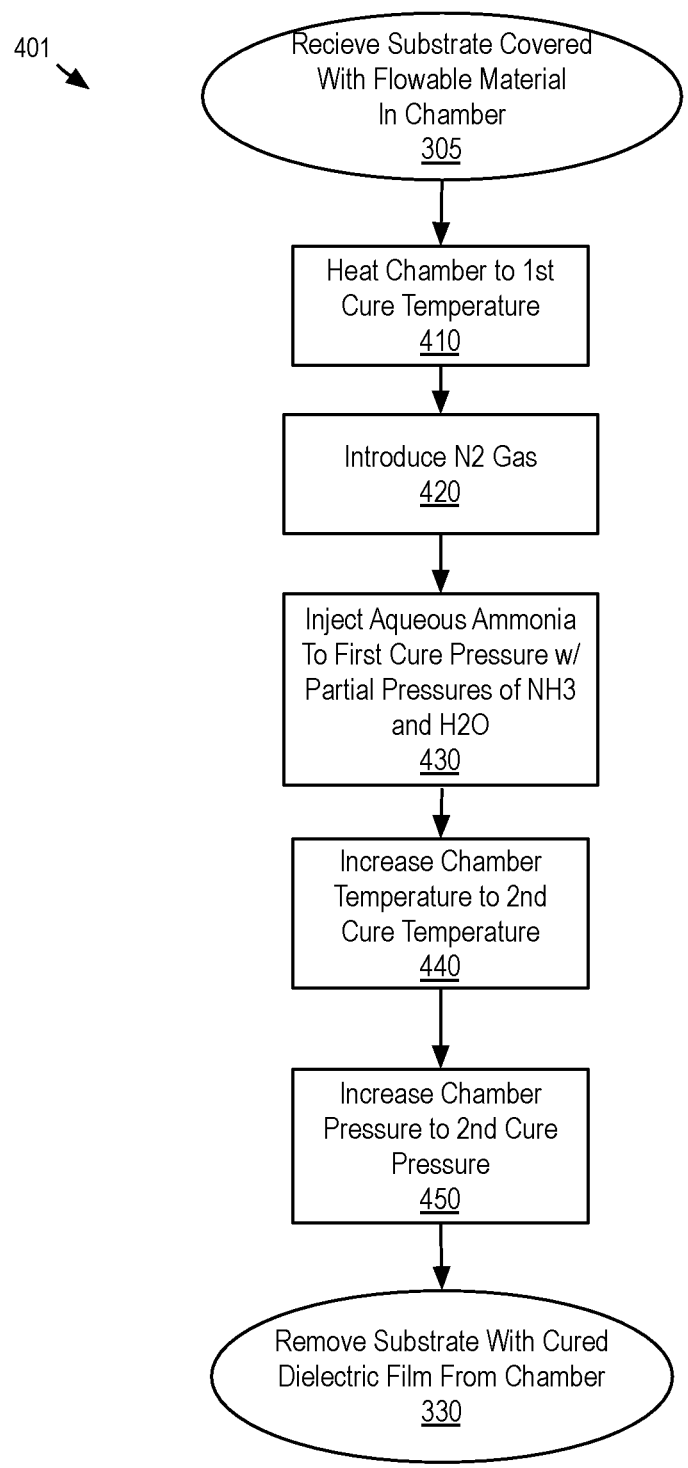
FIG. 4 is a flow diagram illustrating methods of curing a flowable dielectric film, in accordance with some embodiments.

FIG. 4 is a flow diagram illustrating methods 401 for curing a flowable dielectric film, in accordance with some embodiments. Methods 401 again begin at operation 305 where one or more substrates covered in flowable dielectric material are received into a high-pressure cure chamber. Methods 401 continue with heating the HPC chamber to a first cure temperature at operation 410. Operation 410 may be performed before or after substrates are pushed into the HPC chamber. In some embodiments, the chamber is heated to a first cure temperature of at least 175° C., and advantageously at least 200° C. In some embodiments, the chamber is heated to a first cure temperature that is no greater than 250° C. At operation 420, $N_2$ gas is introduced to the cure chamber to reach an inert environmental ambient furnace pressure that exceeds standard atmospheric pressure.

At operation 430, aqueous ammonia is injected directly into the cure chamber and a first cure pressure comprising a partial pressure of aqueous ammonia vapor (i.e., ammonia vapor partial pressure and water vapor partial pressure) is maintained for a first cure time. In advantageous embodiments, all of the aqueous ammonia injected into the cure chamber is vaporized at the first cure pressure and first cure temperature. In a specific embodiment where the first cure temperature is at least 175° C., the first cure pressure is at least 100 PSIA. In a specific embodiment where the first cure temperature is at 250° C., the first cure pressure is at least 250 PSIA. The balance of the cure pressure may be maintained with a gas source, such as $N_2$. The first cure time may be a function of the first cure pressure and cure temperature. The first cure time may be predetermined to be of sufficient duration to outgas a fraction of the ligands present the flowable material. In some embodiments, the first cure time is at least one hour, and advantageously at least two hours.

Methods 401 continue at operation 440 where the HPC chamber temperature is ramped up from the first cure temperature to a second cure temperature. During this ramp, one or more source gases and the aqueous ammonia liquid inject may be continued. In some embodiments, the HPC chamber temperature is increased to a second cure temperature that is at least 100° C. greater than the first cure temperature, and advantageously at least 200° C. greater than the first cure temperature. In some embodiments, the HPC chamber temperature is increased to a second cure temperature of at least 250° C., advantageously at least 300° C., and more advantageously at least 400° C. In some embodiments, the chamber is heated to a second cure temperature that is no greater than 450° C.

Methods 401 continue at operation 450 where the HPC chamber pressure is ramped up from the first cure pressure to a second cure pressure. Operation 450 may be performed concurrently with operation 440 as long as the steam saturation pressure is not exceeded. Alternatively, operation 450 may be performed after completion of temperature ramp operation 450 as the cure pressure ramp may be many times faster than the cure temperature ramp. During the cure pressure ramp, one or more source gases and the aqueous ammonia liquid inject may be continued with either or both of the source gas mass flow rate(s) and aqueous ammonia liquid inject rates increased from the rates employed at the first cure pressure. In some embodiments, the partial pressure of ammonia is maintained approximately constant between the first and second cure pressures. In alternate embodiments, the partial pressure of ammonia at the second cure pressure is greater than the partial pressure of ammonia at the first cure pressure. The second cure pressure developed at operation 450 is advantageously maintained below the saturated vapor pressure of water at the cure temperature. The HPC chamber pressure may be increased to a second cure pressure that is 100 PSI greater than the first cure pressure, and advantageously at least 200 PSI greater than the first cure pressure. In some specific embodiments, the HPC chamber pressure is increased to a second cure pressure of at least 200 PSIA, advantageously at least 300 PSIA, and more advantageously at least 325 PSIA.

The second pressure and temperature are maintained for a second cure time that may again be a function of the cure pressure and cure temperature. The second cure time may be predetermined to be of sufficient duration to cross-link a fraction of the polymers present the flowable material. In some embodiments, the second cure time is at least one hour, advantageously at least two hours, and may be four hours, or more. Methods 401 are then completed with removal of the substrate(s) from the HPC chamber at operation 330.

Figure 6:
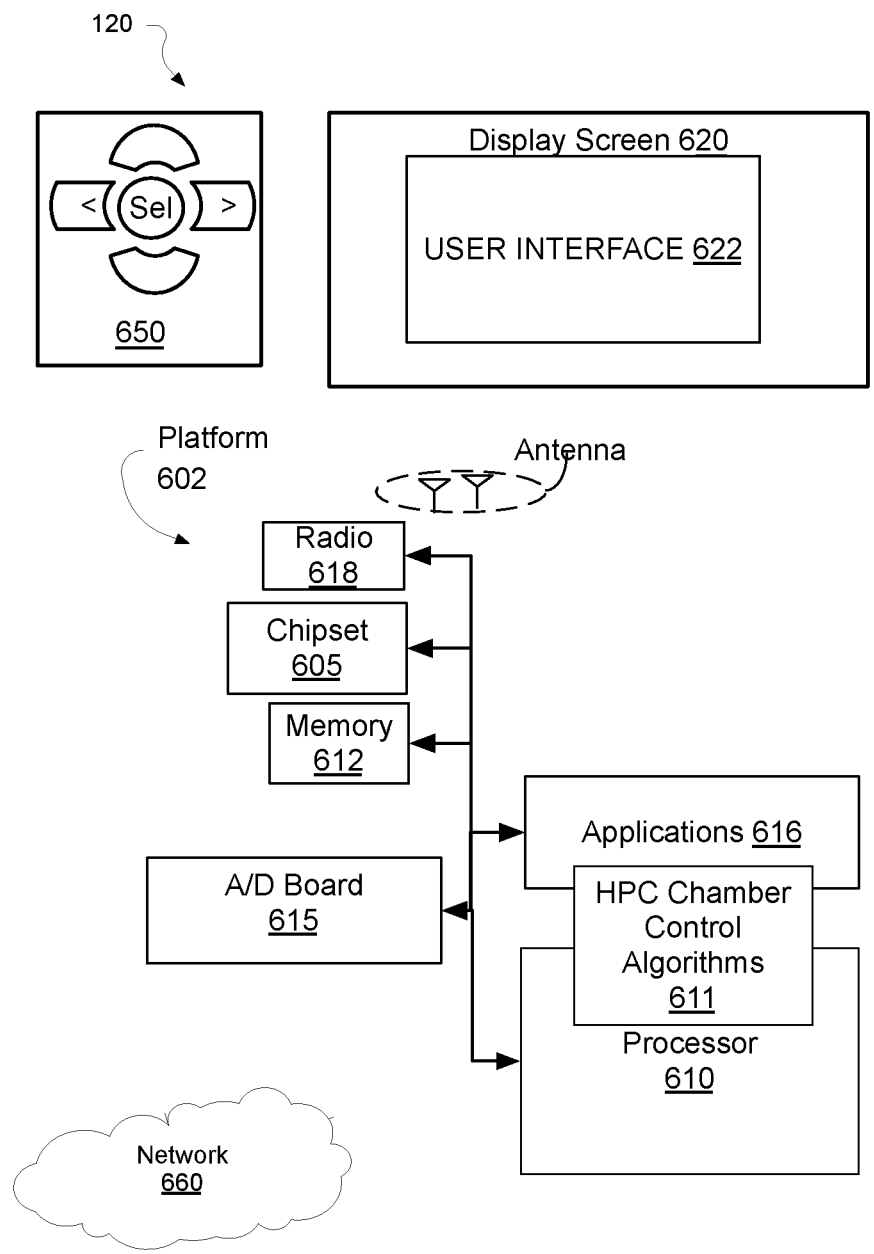
FIG. 6 is a block diagram of a controller employed in the high pressure cure apparatus illustrated in FIG. 1 or FIG. 2, in accordance with some embodiments.

FIG. 6 is a block diagram of controller 120 employed in the HPC apparatus illustrated in FIG. 1 and FIG. 2, in accordance with some embodiments. Controller 120 may cause a heated process chamber to introduce a vapor of aqueous ammonia, in accordance with one or more embodiment. Controller may be a mobile device although system 120 is not limited to this context as controller 140 may also be embedded within a furnace chassis. Controller 240 may be incorporated into a laptop computer, tablet, touch pad, handheld computer, palmtop computer, cellular telephone, smart device (e.g., smart phone, smart tablet or mobile television), mobile internet device (MID), and so forth.

Controller 240 includes a device platform 602 that may implement all or a subset of the various aqueous ammonia delivery functions and high-pressure curing methods described above in the context of FIG. 1-5. In various exemplary embodiments, microprocessor 610 executes cure chamber control algorithms 611 including at least one of aqueous ammonia pumping commands, aqueous ammonia dispense injector commands, chamber pressurization commands, or chamber heating commands, for example as described above. Microprocessor 610 may include fixed or programmable logic circuitry dictating furnace control commands through A/D board 612, for example as described elsewhere herein. In some embodiments, one or more computer readable media may store instructions, which when executed by processor 610, cause the processor(s) to execute one or more high-pressure cure process recipe sequences including aqueous ammonia vapor introduction, such as any of those methods described in detail above. For example, a machine-readable medium may include read only memory (ROM); random access memory (RAM); magnetic disk storage media; optical storage media; flash memory devices; magnetic, electrical, optical, acoustical, or other similarly non-transitory, tangible media.

In embodiments, device platform 602 is coupled to a human interface device (HID) 620. Platform A navigation controller 650 including one or more navigation features may be used to interact with, for example, device platform 602 and/or HID 620. In embodiments, HID 620 may include any television type monitor or display coupled to platform 602 via radio 618 and/or network 660. HID 620 may include, for example, a computer display screen, touch screen display, video monitor, or television-like device, and may be further capable of receiving touch inputs through user interface 622 while an image is displayed on HID 620.

In embodiments, device platform 602 may include a chipset 605, processor 610, memory/storage 612, applications 616, radio 618, and A/D (D/A) board 615. Chipset 605 may provide intercommunication among processor 610, memory 612, A/D board 615, and radio 818. Processor 610 may be implemented as one or more Complex Instruction Set Computer (CISC) or Reduced Instruction Set Computer (RISC) processors; x86 instruction set compatible processors, multi-core, or any other microprocessor or central processing unit (CPU). Memory 612 may be implemented as a volatile memory device such as, but not limited to, a Random Access Memory (RAM), Dynamic Random Access Memory (DRAM), or Static RAM (SRAM). Memory 612 may also be implemented as a non-volatile storage device such as, but not limited to flash memory, battery backed-up SDRAM (synchronous DRAM), magnetic memory, phase change memory, and the like. A/D board 615 may include any A/D conversion needed to cause chuck tilt control to move between level and non-level states. Radio 618 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 818 may operate in accordance with one or more applicable standards.

In embodiments, controller 120 may be implemented as a wireless system, a wired system, or a combination of both. When implemented as a wireless system, controller 120 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, controller 120 may include components and interfaces suitable for communicating over wired communications media, such as input/output (I/O) adapters, physical connectors to connect the I/O adapter with a corresponding wired communications medium, a network interface card (NIC), disc controller, video controller, audio controller, A/D convertor, and the like. Examples of wired communications media may include a wire, cable, metal leads, printed circuit board (PCB), backplane, switch fabric, semiconductor material, twisted-pair wire, co-axial cable, fiber optics, and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that the invention is not limited to the embodiments so described, but can be practiced with modification and alteration without departing from the scope of the appended claims. For example the above embodiments may include specific combinations of features as further provided below.

In one or more first embodiments, a method of curing a dielectric film disposed on a substrate comprises placing the substrate in a chamber, heating the chamber to a cure temperature at least 175° C., pressurizing the chamber to a cure pressure of at least 100 PSIA at least partially with a vapor of aqueous ammonia, and modifying the composition of the dielectric film by maintaining the cure temperature and cure pressure for a predetermined cure time.

In one or more first embodiments, the method of any of the first embodiments further comprises depositing a polymeric film on the substrate, and modifying the composition of the dielectric film further comprises converting the polymeric film to a silicon nitride, silicon dioxide, or silicon carbide.

In one or more third embodiments, for any of the first or second embodiments pressurizing the chamber to a cure pressure further comprises introducing one or more diluent gas into the chamber to reach the cure pressure.

In one or more fourth embodiments, for any of the first, second or third embodiments the partial pressure of $NH_3$ in the chamber is provided entirely by the vapor of aqueous ammonia.

In one or more fifth embodiments, for any of the fourth embodiments the diluent gas is predominantly $N_2$.

In one or more sixth embodiments, for any of the first, second, third, fourth or fifth embodiments the cure pressure is below the saturated vapor pressure of water at the cure temperature.

In one or more seventh embodiments, for any of the sixth embodiments the cure pressure is at least 300 PSIA, and the cure temperature is at least 400° C.

In one or more eighth embodiments, for any of the first, second, third, fourth, fifth, sixth or seventh embodiments pressurizing the chamber to the cure pressure further comprises injecting the aqueous ammonia into the chamber to generate the aqueous ammonia vapor in-situ.

In one or more ninth embodiments, for any of the eighth embodiments the aqueous ammonia comprises a solution of less than 10 w % ammonia.

In one or more tenth embodiments, for any of the eighth embodiments pressurizing the chamber to the cure pressure further comprises injecting the aqueous ammonia into a vaporizer ex-situ of the chamber and conveying the vapor of the aqueous ammonia to the chamber with a carrier gas.

In one or more eleventh embodiments, for any of the first, second, third, fourth, fifth, sixth, seventh, eighth, ninth, or tenth embodiments heating the chamber to the cure temperature and pressurizing the chamber to the cure pressure further comprises heating the chamber to a first cure temperature and a first cure pressure for a first cure time, and heating the chamber to a second cure temperature, higher than the first cure temperature, and a second cure pressure, higher than the second cure pressure for a second cure time.

In one or more twelfth embodiments, for any of the eleventh embodiments the first cure temperature is at least 175° C., the first cure pressure is at least 100 PSIA, the second cure temperature is at least 400° C., and the second cure pressure is at least 325 PSIA.

In one or more thirteenth embodiments, a high-pressure dielectric film curing apparatus comprises a chamber to contain one or more substrates, a heater to heat the chamber, a liquid delivery system comprising an aqueous ammonia source in fluid communication with the chamber, an exhaust system in fluid communication with the chamber, and a controller communicatively coupled to at least the heater, the liquid delivery system, and the exhaust system to maintain the chamber at a cure temperature of at least 175° C., and at a cure pressure of at least 100 PSIA at least partially with a vapor of the aqueous ammonia, for a predetermined cure time.

In one or more fourteenth embodiments, the liquid delivery system in any of the thirteenth embodiments comprises a pump to pressurize the aqueous ammonia source, and an injector to release the pressurized aqueous ammonia into the chamber at a rate set by the controller.

In one or more fifteenth embodiments, the apparatus in any of the thirteenth embodiments further comprises a vaporizer in fluid communication with the chamber and with the liquid delivery system, the vaporizer to generate the vapor of the aqueous ammonia, and a carrier gas source in fluid communication with the vaporizer, the carrier gas to convey the vapor of the aqueous ammonia to the chamber.

In one or more sixteenth embodiments, the controller in any of the thirteenth embodiments is to cause the heater to heat the chamber to a first cure temperature, cause the exhaust system and the liquid delivery system to pressurize the chamber to a first cure pressure for a first cure time, cause the heater to heat the chamber to a second cure temperature, greater than the first cure temperature, and cause the exhaust system and the liquid delivery system to pressurize the chamber to a second cure pressure, greater than the first cure pressure, for a second cure time.

In one or more seventeenth embodiments, for any of the thirteenth, fourteenth, fifteenth, or sixteenth embodiments the first cure temperature is at least 175° C., the first cure pressure is at least 100 PSIA, the second cure temperature is at least 400° C., and the second cure pressure is at least 325 PSIA.

In one or more eighteenth embodiments, a non-transitory computer readable media has instructions stored thereon, which when executed by a computer processor, cause the processor to perform a method comprising placing the substrate in a chamber, heating the chamber to a cure temperature at least 175° C., pressurizing the chamber to a cure pressure of at least 100 PSIA at least partially with a vapor of aqueous ammonia, and modifying the composition of the dielectric film by maintaining the cure temperature and cure pressure for a predetermined cure time.

In one or more nineteenth embodiments, pressurizing the chamber to a cure pressure in any of the eighteenth embodiments further comprises introducing one or more diluent gas into the chamber to reach the cure pressure.

In one or more twentieth embodiments, the cure pressure in any of the eighteenth or nineteenth embodiments is at least 325 PSIA, and the cure temperature is at least 400° C.

In one or more twenty-first embodiments, pressurizing the chamber to the cure pressure in any of the eighteenth, nineteenth, or twentieth embodiments further comprises injecting the aqueous ammonia into the chamber to generate the aqueous ammonia vapor in-situ.

In one or more twenty-second embodiments, a computer-readable media has instructions stored thereon, which when executed by a computer processor cause the processor to perform any of the methods in the first, second, third, fourth, fifth, sixth, seventh, eighth, ninth, tenth, eleventh or twelfth embodiments.

In one or more twenty-third embodiments, high-pressure dielectric film curing apparatus, comprises a chamber to contain one or more substrates, a heating means to heat the chamber, a liquid delivery means comprising an aqueous ammonia source in fluid communication with the chamber, an exhaust means in fluid communication with the chamber, and a controlling means communicatively coupled to at least the heating means, the liquid delivery means, and the exhaust means to maintain the chamber at a cure temperature of at least 175° C., and at a cure pressure of at least 100 PSIA at least partially with a vapor of the aqueous ammonia, for a predetermined cure time.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of curing a dielectric film on a substrate, the method comprising:
    placing the substrate in a chamber;
    heating the chamber to a temperature of at least 175° C.;
    pressurizing the chamber to a pressure of at least 100 PSIA at least partially with a vapor of aqueous ammonia; and
    maintaining the temperature and pressure for a predetermined time.

2. The method of claim 1, further comprising:
    depositing a polymeric film on the substrate; and
    converting the polymeric film into a material comprising predominantly silicon and nitrogen, predominantly silicon and oxygen, or predominantly silicon and carbon.

3. The method of claim 1, wherein pressurizing the chamber further comprises introducing a diluent gas into the chamber.

4. The method of claim 3, wherein the diluent gas is predominantly $N_2$.

5. The method of claim 1, wherein the partial pressure of $NH_3$ in the chamber is provided entirely by the vapor of aqueous ammonia.

6. The method of claim 1, wherein the pressure is below the saturated vapor pressure of water at the temperature.

7. The method in any one of claim 6, wherein the pressure is at least 300 PSIA, and the temperature is at least 400° C.

8. The method claim 1, wherein pressurizing the chamber further comprises injecting the aqueous ammonia into the chamber to generate the vapor.

9. The method of claim 8, wherein the aqueous ammonia comprises a solution of less than 10 wt % ammonia.

10. The method of claim 8, wherein pressurizing the chamber further comprises injecting the aqueous ammonia into a vaporizer external of the chamber and conveying the vapor to the chamber with a carrier gas.

11. The method of claim 1, wherein heating the chamber and pressurizing the chamber further comprises:
    heating the chamber to a first temperature and a first pressure for a first time; and
    heating the chamber to a second temperature, higher than the first temperature, and a second pressure, higher than the second pressure, for a second time, and
    the method comprises modifying a composition of the dielectric film during at least one of the first or second time.

12. The method of claim 11, wherein:
    the first temperature is at least 175° C.;
    the first pressure is at least 100 PSIA;
    the second temperature is at least 400° C.; and
    the second pressure is at least 325 PSIA.

13. A dielectric film curing apparatus, comprising:
a chamber to contain one or more substrates;
a heater to heat the chamber;
a liquid delivery system in fluid communication with the chamber;
an exhaust system in fluid communication with the chamber; and
a controller communicatively coupled to at least the heater, the liquid delivery system, and the exhaust system to maintain the chamber, for a predetermined time, at a temperature of at least 175° C., and at a pressure of at least 100 PSIA at least partially with a vapor of aqueous ammonia supplied through the liquid delivery system.

14. The apparatus of claim 13, wherein the liquid delivery system comprises:
a pump to pressurize an aqueous ammonia source; and
an injector to release the pressurized aqueous ammonia into the chamber at a rate set by the controller.

15. The apparatus of claim 13, wherein the apparatus further comprises:
a vaporizer in fluid communication with the chamber and with the liquid delivery system, the vaporizer to generate the vapor; and
a carrier gas source in fluid communication with the vaporizer, the carrier gas to convey the vapor to the chamber.

16. The apparatus of any one of claim 13, wherein the controller is to:
cause the heater to heat the chamber to a first temperature;
cause the exhaust system and the liquid delivery system to pressurize the chamber to a first pressure for a first time;
cause the heater to heat the chamber to a second temperature, greater than the first temperature; and
cause the exhaust system and the liquid delivery system to pressurize the chamber to a second pressure, greater than the first pressure, for a second time.

17. The apparatus of claim 16, wherein:
the first temperature is at least 175° C.;
the first pressure is at least 100 PSIA;
the second temperature is at least 400° C.; and
the second pressure is at least 325 PSIA.

18. A non-transitory computer-readable media having instructions stored thereon, which when executed by a computer processor cause the processor to perform a method comprising:
placing a substrate in a chamber, a dielectric film over the substrate;
heating the chamber to a temperature at least 175° C.;
pressurizing the chamber to a pressure of at least 100 PSIA at least partially with a vapor of aqueous ammonia; and
maintaining the temperature and pressure for a predetermined time.

19. The media of claim 18, wherein pressurizing the chamber further comprises introducing one or more diluent gas into the chamber to reach the pressure.

20. The media of claim 19, wherein the pressure is at least 325 PSIA, the temperature is at least 400° C., and a composition of the dielectric film is modified during the predetermined time.

* * * * *